United States Patent [19]

Mueller et al.

[11] Patent Number: 5,105,153

[45] Date of Patent: Apr. 14, 1992

[54] GRADIENT SPEED-UP CIRCUIT FOR NMR SYSTEM

[75] Inventors: Otward M. Mueller, Ballston Lake; Peter B. Roemer, Schenectady, both of N.Y.

[73] Assignee: General Electric Company, Schenectady, N.Y.

[21] Appl. No.: 533,210

[22] Filed: Jun. 4, 1990

[51] Int. Cl.⁵ .................................................. G01R 33/20
[52] U.S. Cl. ................................................... 324/322
[58] Field of Search ................. 324/318, 322, 307, 309

[56] References Cited

U.S. PATENT DOCUMENTS

| | | | |
|---|---|---|---|
| 4.694.254 | 9/1987 | Vatis et al. | 324/322 |
| 4.820.986 | 4/1989 | Mansfield et al. | 324/322 |
| 4.961.054 | 10/1940 | Park et al. | 324/322 |

Primary Examiner—Michael J. Tokar
Attorney, Agent, or Firm—Lawrence P. Zale; James C. Davis, Jr.; Marvin Snyder

[57] ABSTRACT

A gradient current speed-up circuit, for use in a higher-speed NMR imaging system having an associated gradient coil, has a gradient power amplifier receiving an input analog signal controlling the current in an amplifier output circuit connected in series between first and second portions of a single gradient coil. Semiconductor switching elements selectively connect the coil portion-amplifier-coil portion between first and second potential sources, and are turned on and off in selected patterns to cause a current to be suddenly applied to, and removed from, flow through the associated gradient coil and the amplifier output circuit.

17 Claims, 2 Drawing Sheets

GRADIENT SPEED-UP CIRCUIT FOR NMR SYSTEM

BACKGROUND OF THE INVENTION

The present invention relates to nuclear magnetic resonance (NMR) imaging systems and, more particularly, to a novel circuit for speeding up the rise and fall times of current pulses utilized to generate gradient magnetic fields in such systems.

It is now well known that NMR imaging and/or spectroscopy systems require at least one power amplifier for each magnetic gradient field direction utilized. These gradient power amplifiers provide the current which generates the magnetic gradient fields, typically in the X,Y and Z dimensions of a Cartesian coordinate system, as necessary to obtain desired spatial resolution. Typically, the gradient power amplifiers are modified forms of linear high-fidelity audio power amplifiers, which typically generate current pulses in the 100–200 ampere range; the relatively good linearity, rise times and fall times of these amplifiers are obtained by the application of relatively high voltages and feedback to output stages containing as many as 100 bipolar transistors. These power amplifiers are relatively inefficient (having typical efficiencies of less than 15%). As higher imaging speeds are utilized, greater electrical stress is applied to existing gradient power amplifiers, as faster rise times require greater voltages (across the same gradient coil inductance) and so increasingly higher voltages and more power dissipation are all required. It is therefore highly desirable to provide a current amplifier circuit, preferably capable of being added to an NMR system in addition to, and between, an existing gradient power amplifier and an associated gradient coil, for providing the faster pulse current waveform rise and fall times necessary for higher-speed imaging use.

One such speed-up circuit is described and claimed in U.S. application Ser. No. 07/407,180, filed Sept. 14, 1989, assigned to the assignee of the present invention and incorporated herein in its entirety by reference; this speed-up circuit is relatively expensive and requires very large spatial volume. Additionally, the circuit does not allow a DC current to flow, either for shimming purposes or for providing a long-time-constant pulse, if required. This lack of precise waveform control is also desirably overcome in any new high speed gradient circuit. Such a circuit would operate with the inductance (about 1 mH) and resistance (on the order of 1 ohm) of a typical conventional whole body gradient coil, and will produce a 1 Gauss/cm gradient field strength at a coil current $I_L$ flow of about 100 amperes. Note that, ignoring resistance, a gradient strength of 1 G/cm will result in about 400 microseconds with an application of 250 volts to the coil. For snapshot imaging, in which an entire image is a acquired in 30 milliseconds or less, gradient strengths on the order of 3 G/cm, with rise times less than 100 microseconds, are required; use of voltages greater than 3 KV and currents of about 300 A are necessary to achieve such speed. Accordingly, a gradient magnetic field speed-up circuit allowing precise control during ramp waveform portions and providing for DC shim currents and the like, is highly desirable.

BRIEF SUMMARY OF THE INVENTION

In accordance with the invention, a gradient current speed-up circuit for use with a split-winding gradient coil in a higher-speed NMR imaging system, comprises: a gradient power amplifier receiving an input analog signal controlling amplifier output current in an output circuit in series between first and second portions of the gradient coil winding; and a plurality of semiconductor switching elements for connecting the series circuit of first half-winding, amplifier and second half-winding between selected first and second potential sources in selected patterns to cause a current to be suddenly applied to, and removed from, flow through the associated gradient coil.

In a presently preferred embodiment, the amplifier facilitates flow of a shimming current in the coil windings.

Accordingly, it is an object of the present invention to provide a novel gradient current speed-up circuit for use in NMR imaging and spectroscopy systems.

This and other objects of the present invention will become apparent upon reading of the following detailed description, when considered in conjunction with the associated drawings.

DETAILED DESCRIPTION OF THE INVENTION

Figure 1:
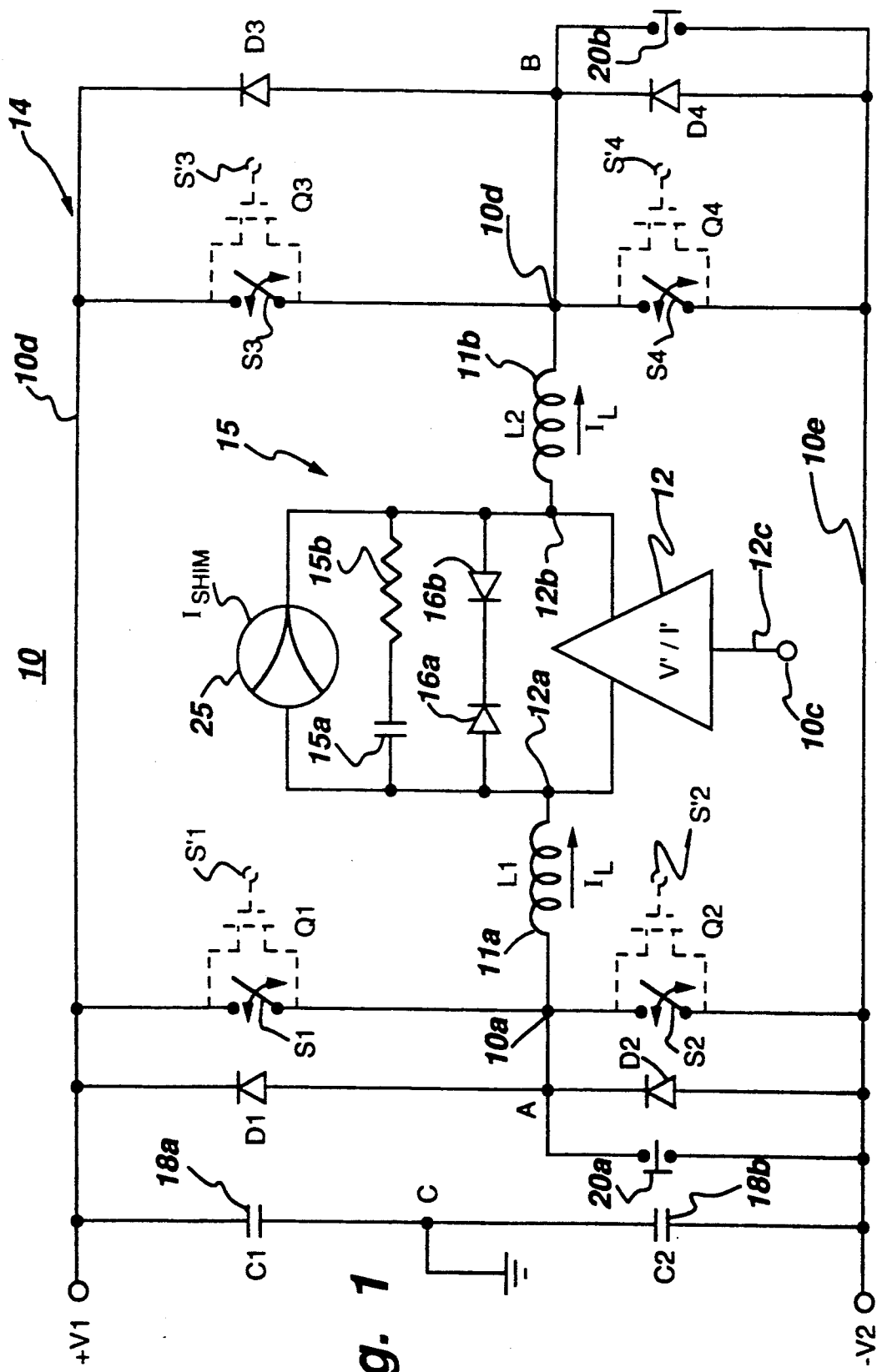
FIG. 1 is a schematic block diagram of a single directional-gradient-magnetic-field-providing portion of a NMR system, and of a presently preferred embodiment of the novel circuit of the present invention.

Referring initially to FIG. 1, a presently preferred embodiment of our gradient current speed-up circuit 10 is utilized with an associated gradient coil 11, which comprises a first portion 11a, of inductance L1, and a second portion 11b, of inductance L2. The two portions, which may have equal inductance, are connected in series with the output circuit, between terminals 12a and 12b, of a gradient power amplifier 12. The series-connected coil portion 11a amplifier output circuit-coil portion 11b is connected between circuit A and B terminals 10a and 10b, for providing the magnetic-field gradient in one (of a plurality) of directions within the operating volume of a NMR imaging and/or spectroscopy system. Gradient coil 11 is driven, in part, by gradient power amplifier 12. One possible gradient power amplifier is the model 8607 bipolar power supply manufactured by Tecron; because a maximum output voltage of about ±160 volts and a peak output current of about ±130 amperes is typical for such amplifier/supply units, several units may have to be connected in series/parallel, to supply high voltages V' and currents I' needed at the composite amplifier output 12a/12b. The input 12c of each gradient amplifier 12 receives, in parallel, an analog input signal from circuit input 10c. The input signal may be provided from the analog output of a digital-to-analog converter (DAC) means (not shown), which receives an m-bit digital data input control signal from a system data bus.

Typically, a pair of linear gradient power amplifiers are series-connected, e.g. to realize a total voltage swing of ±320 volts. If a shielded gradient coil is used, the "outer coil" shield has a substantially zero total inductance (e.g. two portions wound in opposite directions) and would be connected between the two amplifier output circuits, with each of the "inner coil" half windings connected between one of terminals A or B, and an adjacent, but different end of the amplifier-outer coil-amplifier series-connected subcircuit.

A power switching means 14 controls the flow of current $I_L$ through the two portions 11a/11b of the coil of FIG. 1. Means 14 utilizes a power supply means not shown) which may have first and second power supplies with respective amplitudes $V_1$ and $V_2$, which may, but need not, be variable, and may be programmable, via a system data bus; the power supplies are so pated so as to cause a first circuit supply terminal 10d to be at a positive polarity with respect to a circuit common potential and to cause a negative polarity potential to be present at a second circuit supply bus 10e with respect to the common potential. If desired, a storage element 18a or 18b, such as a capacitor and the like, can be connected between common potential and each of terminals 10d and 10e. A plurality of power switching means S1 to S4 control the direction of the gradient current $I_L$ flowing through the gradient coil 11. In one presently preferred configuration, four switch means S1 through S4 (which may each be a semiconductor switching element Q1-Q4 with a parallel-connected commutating diode D1-D4) are utilized in a full-bridge configuration; thus, a first power switching means S1, controlled by a first control signal S'1, is connected between positive supply bus 10d and first winding terminal 10a, which terminal is controllably connectable to circuit negative bus 10e through a second power switching means S2, itself controlled by a second independent control signal S'2. Similarly, upper and lower power switching means S3 and S4 are connected in series between bus 10d, second winding terminal 10b and bus 10e, and are respectively operated by independent control signals S'3 and S'4. All of signals S'1-S'4 can be supplied via a system or circuit data bus. If switching means 14 utilizes semiconductor switches, which typically can only switch current off in one direction, then the reverse protection diodes are required. An amplifier protection subcircuit 15 uses a series-connected snubbing capacitor 15a and snubbing resistor 15b, shunted by series-connected and oppositely-polled zener diodes 16a/16b. A shim current $I_{SHIM}$ can be commanded from amplifier 12 and appears to effectively be a sourcing means 25 coupled between the amplifier output terminals 12a/12b; thus, a DC shimming current can be caused to flow through both the winding portions of gradient coil 11, in either direction, and with an amplitude as required. Polarity and amplitude of the shim current is thus controllable completely separate from the gradient current $I_L$ applied to coil 11. As long as current can flow in both directions, through each leg from one of buses 10d or 10e to one of terminals 10a or 10b, arbitrary staircase-type waveforms of gradient coil current $I_L$ can be provided as well as ramp and flat-top portions of gradient signals with desired shapes, in addition to any shim current applied to the coil. Further, this circuit allows for gradient current compensation, i.e. a technique to modify the shape of the gradient current waveform, typically on the order of 1 percent, to compensate for eddy currents induced in the NMR system cryostat.

Figure 2:
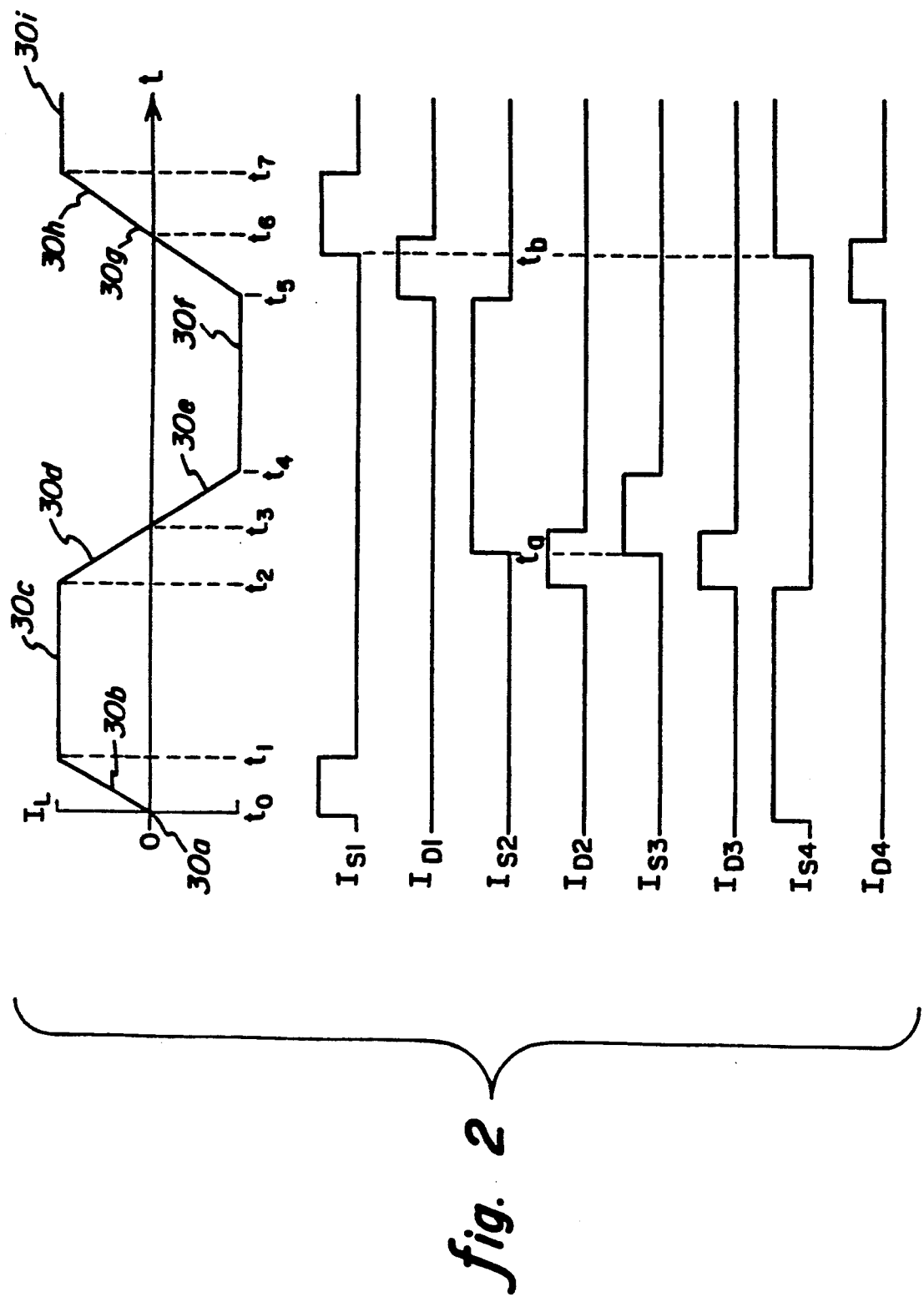
FIG. 2 is a time-synchronized set of signals found in the circuit of FIG. 1 and useful in appreciating operation thereof.

Referring now to FIGS. 1 and 2, the operation of our speed-up circuit can be understood by consideration of the switching necessary to produce a gradient coil current signal waveform 30. Initially, a first current portion 30a, prior to start time $t_0$, is of zero amplitude. A current $I_L$ ramp portion 30b increases from zero to a positive value, achieved at time $t_1$. The positive value is held substantially constant during a flat-top portion 30c, from time $t_1$ through time $t_2$, at which time a ramp-down current portion 30d occurs, with the current reaching a zero amplitude at time $t_3$. Thereafter, the coil current continues to decrease in negative-polarity down-ramp portion 30e, from time $t_3$ to time $t_4$, at which time a negative-polarity flat-top portion 30f is achieved and held until time $t_5$. Thereafter, a positive-ramp, negative-polarity portion 30g occurs, ending at time $t_6$, when the current is back at zero. Further waveform ramp portions, such as ramp 30h, and flat-top portions, such as portion 30i, may follow, as desired.

All switching means S1 through S4 may be open-circuited prior to time $t_0$; reset means 20a/20b may also be closed prior to time $t_0$, but must be open-circuited at time $t_0$. At time $t_0$, ramp 30b commences as first switching means S1 and fourth switching means S4 are closed, responsive to respective signals S'1 and S'4, so that the Current $I_L$ flows therethrough, respectively from bus 10d to terminal 10a, and from terminal 10b to bus 10e. The coil current rises at a rate determined from the solution of the circuit equation $V=RI_L+L(dI_L/dt)$, where R is the total coil resistance, V is the high voltage from bus 10d to bus 10e, and L is the total coil inductance. During waveform ramp portions, the RI voltage drop is small compared to the inductive drop across gradient coil 11; thus, the current rises at an approximate rate of V/L, or about 3.5 amperes/microsecond for a 1 millihenry coil at $V_1+V_2=3500$ volts. When the coil current $I_L$ reaches the desired level at time $t_1$, first switching S1 means is commanded (by return of its control signal S'1 to a low amplitude) to its open-circuit condition, while fourth switch means S4 is left closed. Fourth switching means S4 is kept closed during the entire flat top portion 30c, and is open-circuited only at time $t_2$. During the flat top portion 30c, the gradient coil current $I_L$ "free wheels" through closed switching means S4, now-conducting second reverse-conduction means (e.g. diode D2), to terminal 10a and thence back into the coil. Concurrently, the signal for ramp portion 30b is applied to terminal 10c, and the linear amplifier 12 provides the voltage necessary to maintain the coil current $I_L$ amplitude needed to overcome the voltage drop across coil resistance R.

At the end of flat-top portion 30c, switch means S4 is commanded to the open-circuited condition by removal of control signal S'4. The current in the gradient coil winding continues to flow, due to the inductively stored energy, and causes the voltage across the coil to rapidly rise until that voltage reaches the high voltage supply value, between buses 10d and 10e. When this $V_1+V_2$ magnitude voltage is reached, reverse-conduction means D2 and D3 conduct and current thus flows from negative-polarity bus 10e, through diode D2, to terminal 10a, thence through the coil to terminal 10b, thence through diode D3 to bus 10d. At this time, half of the high voltage, e.g. about $-1750$ volts, appears across each capacitor 18a/18b, and the coil current $I_L$ ramps down at a rate of about $-3.5$ amps/micro-second, in portion 30d. At some time $t_a$, after switch S4 is open and before the down-ramping current in portion 30d reaches a zero magnitude, second switch means S2 and third switch means S3 are commanded to the closed position. Because the second and third switching means are closed before the coil current reaches zero magnitude, the coil current will continue to ramp through zero in the negative direction, into portion 30e. When the desired maximum negative current is reached, at time t4, third switch means S3 is open-circuited and linear amplifier 12 holds the current during flat-top portion 30f substantially constant at the value commanded. Switching means S2 remains closed until the end of the flat-top portion 30f, and is open-circuited at time t5, as the current begins to ramp back towards zero, in portion 30g.

It will be seen that, as long as the commanded waveforms do not cause the linear amplifier output to go beyond its voltage range, the entire waveform is precisely controlled by the input signal. The linear amplifier output excess voltage can account for high voltage power supply droop and for small changes in the load impedance (i.e. the impedance of gradient current 11). It will be seen that other waveform adjustments, such as for eddy current compensation and the like, are also possible.

It will also be seen that this speed-up circuit only need be switched on where necessary; many pulse sequence portions do not require very fast gradient switching and so the high voltage/high-speed features need not be utilized to obtain a desired gradient waveform. Thus, it will be understood that the linear amplifier can be utilized without turning on the speedup portion (switching means 14), so that very small gradient pulses can be more easily controlled. With the speed-up circuit 14 portions engaged, very small gradient pulses may be very difficult to control, as high power semiconductor switching devices, such as GTOs and the like, have minimum on-time and off-time requirements, as well as finite time delays. Preferably, if the speed-up portion is not being utilized, terminals 10a/10b should be short-circuited, as by commanding control signals S'1 and S'3 (or S'2/S'4) to close switching means S1 and S3 (or S2/S4), or by closing relays 20a and 20b. With the coil ends, at terminals 10a/10b, short circuited, the reactance seen by linear amplifier 12 can be made relatively small. If shorting by S1 and S3 (or S2/S4) is used, there will be no mechanical switch necessary for the shorting activity, and pulse sequences can be constructed which involve very strong pulse gradients using the speed up circuit, rapidly followed by very small and precisely controlled pulses utilizing only the linear amplifier portion.

While one presently preferred embodiment of our novel invention has been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A gradient speed-up circuit, for use in a high-speed NMR imaging system, comprising:
   a gradient power amplifier means for creating an output signal which is linearly related to a received control signal for controlling a current flowing through an output circuit;
   a gradient coil having at least one portion series connected to said amplifier output circuit;
   a high voltage power supply being series coupled to the gradient power amplifier means and gradient coil; and
   a power switching means being a full-bridge circuit for connecting the high voltage power supply in series with the gradient power amplifier means and the gradient coil, causing a current flow from the high voltage power supply through the gradient power amplifier means, and the gradient coil to change the gradient coil current, the power switching means being responsive to control signals.

2. The circuit of claim 1, further comprising means for protecting said amplifier output circuit from excessive voltage thereacross.

3. The circuit of claim 1, wherein the amplifier means causes a DC shimming current to flow.

4. The circuit of claim 1, wherein the amplifier means is connected between said first and second coil portions.

5. The circuit of claim 1, wherein said power switching means includes a plurality of individually-controllable semiconductor switching devices.

6. The circuit of claim 1, wherein said power switching means includes a plurality of individually-controllable semiconductor switching devices selected from the group consisting of gate turn-on thyristors (GTOs), insulated gate Bipolar transistors (IGBTs), and metal oxide semiconductor field effect transistors (MOSFETs).

7. The circuit of claim 6, wherein each device is connected in parallel with a reverse-conduction element.

8. A gradient speed-up circuit, for use in a high-speed NMR imaging system, comprising:
   gradient power amplifier means for controlling a current flowing through an output circuit, responsive to an input signal;
   a gradient coil having separate first and second portions, each series connected to an opposite end of said amplifier output circuit, said amplifier means adapted to cause a shim current to flow through both portions of said gradient coil; and
   power switching means for providing a current flow through the series circuit of said amplifier means and coil portions to change the coil current responsive to control signals.

9. A gradient speed-up circuit, for use in a high-speed NMR imaging system, comprising:
   gradient power amplifier means for controlling a current flowing through an output circuit, responsive to an input signal, the power amplifier means including a pair of amplifiers each having a separate output circuit, and a shield winding connected between the output circuits of the amplifiers;
   a gradient coil having separate first and second portions, each series connected to an opposite end of said amplifier output circuit such that an amplifier-shield winding-amplifier subcircuit is connected between the coil first and second portions; and
   power switching means for providing a current flow through the series circuit of said amplifier and coil portions to change the coil current responsive to control signals.

10. The gradient speed-up circuit of claim 1 in which inductance of the gradient coil and capacitance of the power switching means have values that render the circuit non-resonant.

11. The gradient speed-up circuit of claim 1 wherein the gradient power amplifier means is responsive to the current passing through the gradient coil and provides high accuracy and stability in its output during both constant current output, and changing current output.

12. The gradient speed-up circuit of claim 1 wherein the gradient power amplifier means is responsive to a droop in voltage high voltage power supply, and provides high accuracy and stability in its output during both constant current output, and changing current output.

13. The gradient speed-up circuit of claim 1 wherein the gradient power amplifier means, and the power switching comprise means for generating trapezoidal and triangular pulse current waveforms in the gradient coil.

14. The gradient speed-up circuit of claim 1 wherein the gradient power amplifier means, and the power switching comprise means for generating sinewave currents by switching off the high-voltage power supply.

15. The gradient speed-up circuit of claim 1 configured to generate a time-changing current waveform which changes slowly, having an upper set of switches of the full-bridge circuit open and a lower set of switches of the full bridge circuit closed disconnecting the high-voltage power supply from the gradient coil.

16. The gradient speed-up circuit of claim 1 wherein the gradient power amplifier means includes linear amplifiers whose output voltage is relatively small compared to that of the high voltage power supply so as to provide a high efficiency power conversion circuit.

17. The gradient speed-up circuit of claim 1 wherein the amplifier means is responsive to the current passing through the gradient coil allowing the gradient power amplifier means to compensate for the reduction in voltage of the high voltage power supply due to the gradient coil losses thereby permitting the use of a low-cost unregulated high voltage supply.

* * * * *